US007957183B2

(12) United States Patent
Yang

(10) Patent No.: US 7,957,183 B2
(45) Date of Patent: Jun. 7, 2011

(54) SINGLE BIT LINE SMT MRAM ARRAY ARCHITECTURE AND THE PROGRAMMING METHOD

(75) Inventor: Hsu Kai Yang, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 234 days.

(21) Appl. No.: 12/387,537

(22) Filed: May 4, 2009

(65) Prior Publication Data

US 2010/0277974 A1    Nov. 4, 2010

(51) Int. Cl.
G11C 11/14        (2006.01)
(52) U.S. Cl. .......................................... 365/171; 365/158
(58) Field of Classification Search .................. 365/171, 365/158
See application file for complete search history.

(56) References Cited

U.S. PATENT DOCUMENTS

| | | | |
|---|---|---|---|
| 7,272,034 | B1 | 9/2007 | Chen et al. |
| 7,286,395 | B2 | 10/2007 | Chen et al. |
| 7,379,327 | B2 | 5/2008 | Chen et al. |
| 7,443,718 | B2 | 10/2008 | Ito et al. |
| 7,884,433 | B2 * | 2/2011 | Zhong et al. ................. 257/421 |
| 2007/0097730 | A1 | 5/2007 | Chen et al. |
| 2007/0285975 | A1 | 12/2007 | Kawahara et al. |
| 2007/0297223 | A1 | 12/2007 | Chen et al. |
| 2008/0061388 | A1 | 3/2008 | Diao et al. |

OTHER PUBLICATIONS

"A Novel Nonvolatile Memory with Spin Torque Transfer Magnetization Swithcing: Spin-RAM," by M. Hosomi et al., 2005 IEEE, 0-7803-9269-8/05, 4 pages.
"2 Mb SPRAM (SPin-Transfer Torque RAM) With Bit-by-Bit Bi-Directional Current Write and Parallelizing-Direction Current Road," by Takayuki Kawahara et al., IEEE Journal of Solid-State Circuits, vol. 43, No. 1, Jan. 2008, pp. 109-120.

* cited by examiner

Primary Examiner — Michael T Tran
(74) Attorney, Agent, or Firm — Saile Ackerman LLC; Stephen B. Ackerman; Billy Knowles

(57) ABSTRACT

An SMT MRAM device includes a plurality of SMT MRAM cells arranged in an array of rows and columns. Single bit lines connect the columns of the SMT MRAM cells for receiving an in-phase data signal. Source lines connect pairs of rows of the SMT MRAM cells for receiving an out-of-phase data signal. Out-of-phase switching devices are connected to the source lines for selectively transferring the out-of-phase signal to the at least one source lines. Column select transistors are connected to the single bit lines for transferring an in-phase data signal to a selected column of the SMT MRAM cells. A precharge circuit selectively charges or discharges the single bit lines. Ground switching devices selectively connect to the source lines to a ground reference voltage source. A method for programming a selected SMT MRAM cell within a provided SMT MRAM device is described.

32 Claims, 5 Drawing Sheets

FIG. 1 – Prior Art

SINGLE BIT LINE SMT MRAM ARRAY ARCHITECTURE AND THE PROGRAMMING METHOD

BACKGROUND OF THE INVENTION

1. Field of the Invention

This invention relates generally to circuits and methods for programming memory array structures. More particularly, this invention relates circuits and methods for bi-directionally programming spin moment transfer magnetic random access memory (MRAM) cells in an array.

2. Description of Related Art

The term Spin-RAM refers to a magnetic tunnel junction (MTJ) random access memory (RAM). In this context, the term "spin" refers to the angular momentum of electrons passing through an MTJ that will alter the magnetic moment of a free layer of an MTJ device. Electrons possess both electric charge and angular momentum (or spin). It is known in the art that a current of spin-polarized electrons can change the magnetic orientation of a free ferromagnetic layer of an MTJ via an exchange of spin angular momentum.

"A Novel Nonvolatile Memory with Spin-torque Transfer Magnetization Switching: Spin-Ram", Hosomi, et al., IEEE International Electron Devices Meeting, 2005. IEDM Technical Digest. December 2005, pp.: 459-462, provides a nonvolatile memory utilizing spin-torque transfer magnetization switching (STS), abbreviated Spin-RAM. The Spin-RAM is programmed by magnetization reversal through an interaction of a spin momentum-torque-transferred current and a magnetic moment of memory layers in magnetic tunnel junctions (MTJs), and therefore an external magnetic field is unnecessary as that for a conventional MRAM.

Refer now to FIG. 1 for an explanation of and spin torque transfer magnetization switching (STS) or spin moment transfer (SMT) in an MTJ element 5 as described Hosomi, et al. A spin-torque MTJ 5 element has two ferromagnetic layers, F1 10 and F2 15, and a spacer layer 20 between the ferromagnetic layers, F1 10 and F2 15. The ferromagnetic layer, F1 10 is a pinned magnetic layer. The spacer layer 20 is a tunnel barrier layer. The ferromagnetic layer F2 15 is a free magnetic layer. When a spin polarized electron 40 flows through the ferromagnetic layers, F1 10 and F2 15, the spin direction 42 rotates according to the directions of magnetic moment M2 55 and M1 50 respectively to the directions 43 and 44. The rotation of spin direction of the electrons in the ferromagnetic layers, F1 10 and F2 15 are the origin of a spin-torque, dM1/dt 47 and dM2/dt 45, to the magnetic moment M1 50 and M2 55. If the given torque is large enough, magnetization of ferromagnetic layer F2 15 and thus the magnetic moment M2 55 is reversed. The magnetization of the ferromagnetic layers, F1 10 and F2 15 transforms from parallel to anti-parallel alignment. This changes the MTJ element 5 from a low resistance state to a high resistance state thus changing the logic state of the MTJ element from a first logic state (0) to a second logic state (1).

The voltage source 35 provides the programming voltage $V_{PROG}$ that generates the programming current $i_{PROG}$ that is reversed appropriately change the programming state of the MTJ element 5.

"2 Mb SPRAM (SPin-Transfer Torque RAM) with Bit-by-Bit Bi-Directional Current Write and Parallelizing-Direction Current Read", Kawahara, et al., IEEE Journal of Solid-State Circuits, January 2008, Vol.: 43, Issue: 1, pp: 109-1, Posted online: 2008 Jan. 28 09:50:32.0, describes a 1.8 V, 2 Mb SPRAM chip. The SPRAM chip features an array scheme with bit-by-bit bi-directional current writing to achieve proper spin-transfer torque parallelizing-direction current reading with a low-voltage bit-line for preventing read disturbances.

U.S. Pat. No. 7,272,034 (Chen, et al.) provides a current driven switching of magnetic storage cells utilizing spin transfer in magnetic memories. The magnetic storage cells include a magnetic storage element and one or more selection transistors. The magnetic element is capable of being programmed using spin transfer induced switching by a write current driven through the at least one magnetic element. The selection transistor is configured to allow the magnetic element to be alternately selected for writing and reading.

U.S. Pat. No. 7,286,395 (Chen, et al.) and U.S. Patent Application 2007/0097730 (Chen et al.) teach current driven switched magnetic storage cells having improved read and write margins in a magnetic memory array. The memory array has an array of the magnetic storage cells, at least one bit line, and multiple source lines. Each magnetic storage cell includes a magnetic element that is programmed to a high resistance state by a first write current driven through the magnetic element in a first direction and to a low resistance state by a second write current driven through the magnetic element in a second direction. The bit line(s) and the source lines are configured to drive the first write current through the magnetic element in the first direction, to drive the second write current through the magnetic element in the second direction, and to drive at least one read current through the magnetic element in a third direction that does not destabilize the low resistance state.

U.S. Pat. No. 7,379,327 (Chen, et al.) and U.S. Patent Application 2007/0297223 (Chen, et al.) describe a spin transfer magnetic memory that includes magnetic storage cells in an array, bit lines, and source lines. Each magnetic storage cell includes at least one magnetic element. Each magnetic element has free and pinned layer(s) and a dominant spacer. The magnetic memory is configured such that the direction of the read current(s) flow between the free layer(s) and the dominant spacer by the ratios of the low resistance state read current and the minimum low resistance state write current compared to the ratio of the maximum high resistance state read current minimum high resistance state write current.

U.S. Pat. No. 7,443,718 (Ito, et al.) illustrates writing to a magnetic tunnel junction (MTJ) by providing a current IMTJ through the magnetic tunnel junction. The current IMTJ is at the DC threshold current for a first time duration and then the current IMTJ is driven to a level larger than the DC threshold current for a second time duration to cause the magnetic tunnel junction to switch states.

U.S. Patent Application 2007/0285975 (Kawahara et al.) describes a memory using spin transfer torque. The state of the spin is made unstable by applying a weak pulse before rewriting to reduce rewrite current. Reading of high-speed operation is performed with current in a regime where the current non-linearly increases corresponding to the pulse width to suppress disturb.

U.S. Patent Application 2008/0061388 (Diao et al.) provides magnetic or magnetoresistive tunnel junction devices that have a multilayer insulator barrier layer to produce balanced write switching currents in the device circuitry. Alternately, the devices have balanced critical spin currents required for spin torque transfer induced switching of the magnetization, or both for the MTJs under both the forward and reversed bias directions.

SUMMARY OF THE INVENTION

An object of this invention is to provide single bit line for facilitating programming of selected spin moment transfer (SMT) MRAM cells in an array of SMT MRAM cells.

Another object of this invention is to provide a method for programming SMT MRAM cells in an array of SMT MRAM cells.

To accomplish at least one of these objects, an SMT MRAM device includes a plurality of SMT MRAM cells arranged in an array of rows and columns. Within the array of SMT MRAM cells, a plurality of single bit lines connects the columns of the SMT MRAM cells for receiving an in-phase data signal. A plurality of source lines connects pairs of rows of the SMT MRAM cells for receiving an out-of-phase data signal.

A plurality of out-of-phase switching devices is connected to the plurality of source lines. Each out-of-phase switching device has a first port connected to at least one source line of the plurality of source lines for selectively transferring the out-of-phase signal to the at least one source line. A second port is connected to receive the out-of-phase data signal and a control port that is connected to receive a source line select signal for activating the switching device for transferring the out-of-phase data signal to the at least one source line.

The SMT MRAM device has a plurality of column select transistors connected to the plurality of single bit lines. Each of the plurality of column select transistors has a first port connected to one of the plurality of single bit lines. A second port is connected to receive the in-phase data signal and a control port that is connected to receive a column select signal for selecting one of the columns of the SMT MRAM cells. The SMT MRAM device further includes a precharge circuit connected to the plurality of single bit lines for charging or discharging the single bit lines.

A plurality of ground switching devices is connected to the source lines. Each ground switching device of the plurality of ground switching devices has a first port connected to at least one of the source lines. A second port is connected to a ground reference voltage source and a control port connected to receive a ground switch select signal for activating the ground switching device to apply the ground reference voltage source to source lines of non-selected SMT MRAM cells. The ground switch select signal is an inverse of the source line select signal.

A method for programming a selected SMT MRAM cell within a provided SMT MRAM device has two separate processes one for programming the selected SMT MRAM cell to a first state (logical 1) and a second for programming the selected SMT MRAM cell to a second state (logical 0). Programming the selected SMT MRAM cell to the first state (logical 1) begins by setting the in-phase data signal to a first level (Low) and the out-of-phase data signal to a second level (High). The plurality of single bit lines is briefly charged to set them to the second level (High). The column select signal is activated for selecting the single bit line connected to the selected MRAM cell. The source line select signal is then activated for selecting the source line connected to the selected MRAM cell. The current flows in a first direction from the out-of-phase data signal through the source line and through the selected MRAM cell to the single bit line to the in-phase data signal.

The second process of the method for programming the selected SMT MRAM cell for programming the selected SMT MRAM cell to the second state (logical 0) begins by setting the in-phase data signal to the second level (High) and the out-of-phase data signal to the second level (Low). The plurality of single bit lines is briefly discharged to set them to the first level (Low). The column select signal is activated for selecting the single bit line connected to the selected MRAM cell. The source line select signal activated for selecting the source line connected to the selected MRAM cell. The current flows in a second direction from the in-phase data signal through the single bit line and through the selected MRAM cell to the source line to the out-of-phase data signal.

DETAILED DESCRIPTION OF THE INVENTION

Figure 1:
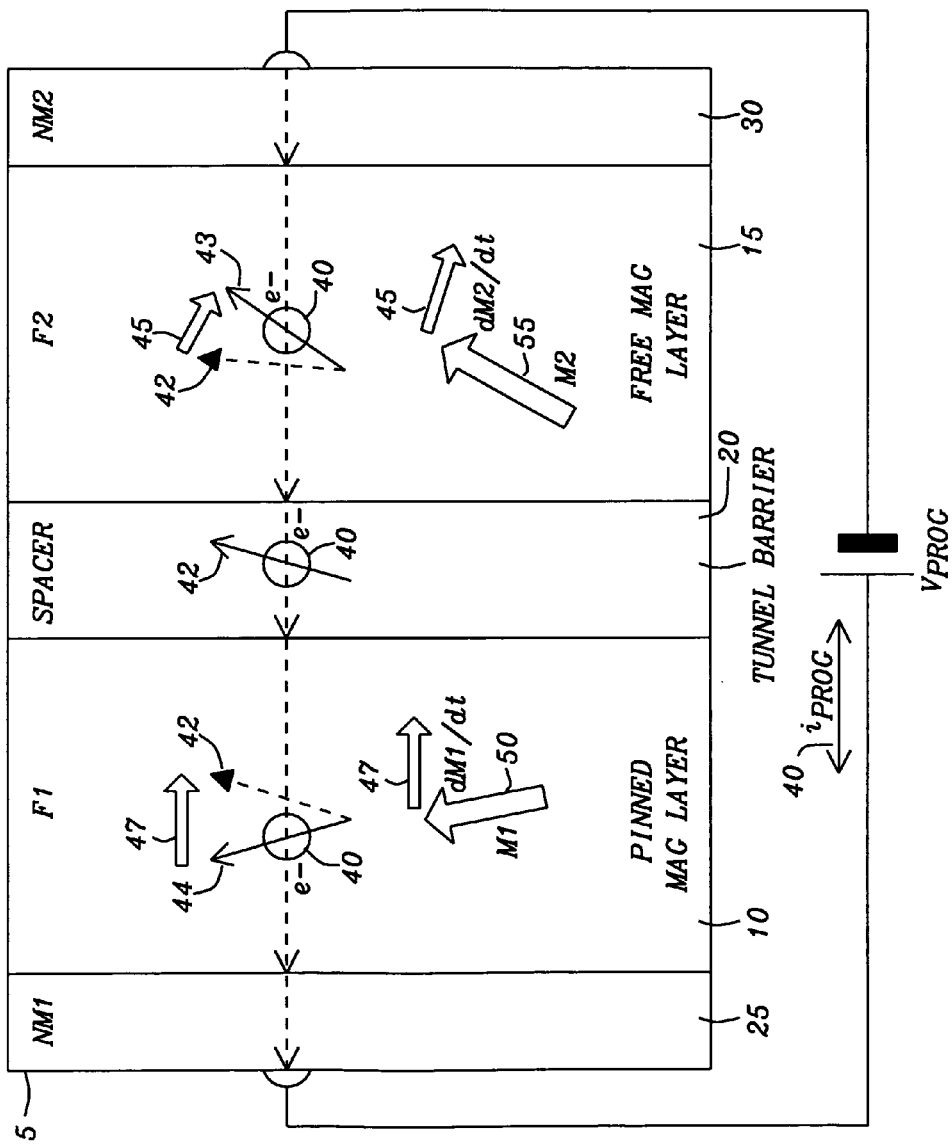
FIG. 1 is a diagram of a spin-torque magnetic tunnel junction of the prior art.
Figure 2:
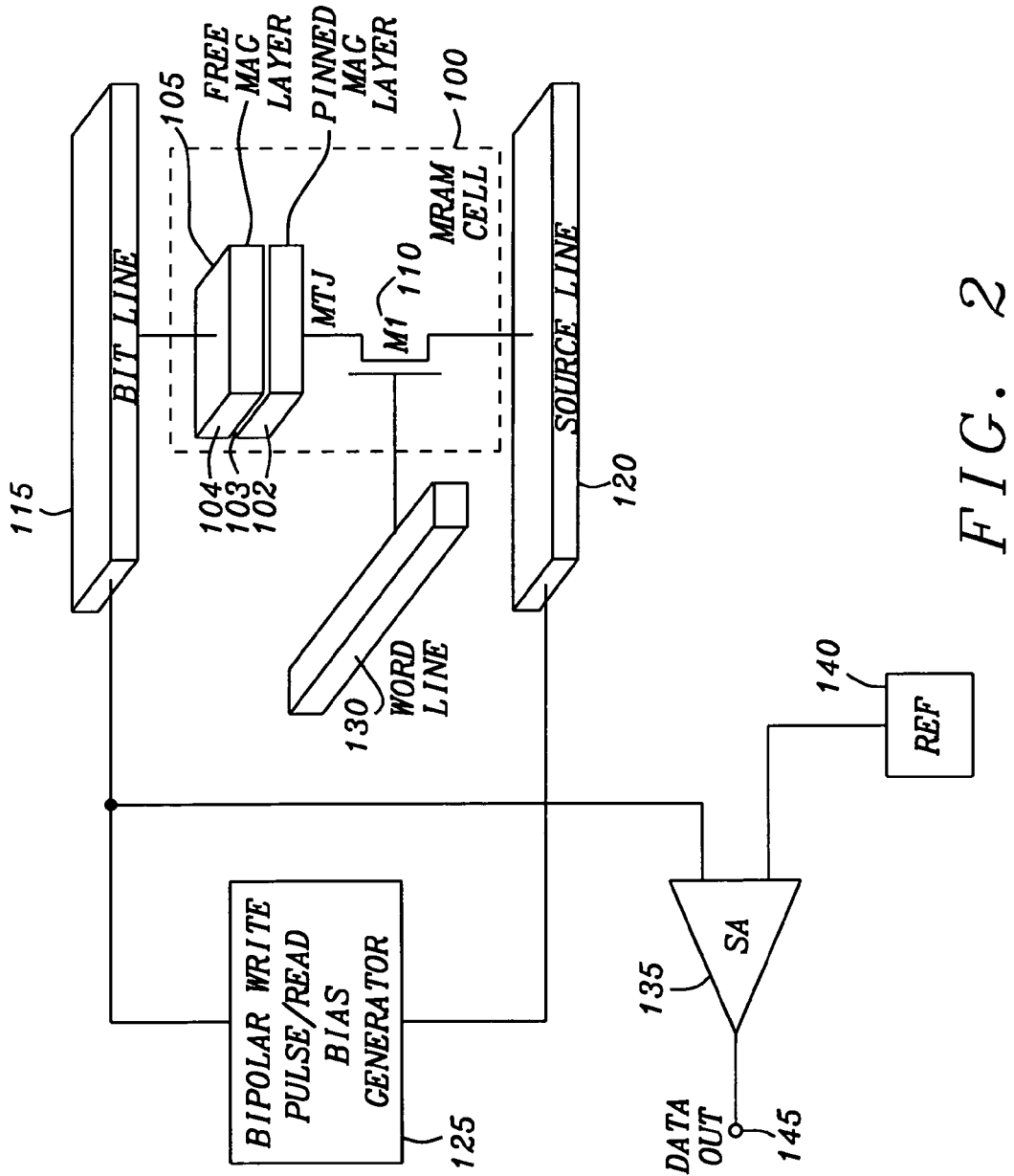
FIG. 2 is a functional diagram of a spin-torque magnetic tunnel junction memory cell and its peripheral circuitry.

As illustrated in FIG. 2, a spin moment transfer (SMT) MRAM cell 100 consists of an MTJ element 105 and a Metal Oxide Semiconductor (MOS) transistor 110. The MTJ element 105 is composed of a pinned ferromagnetic layer 102 and a free ferromagnetic layer 104, and a tunnel barrier layer 103 as described in FIG. 1. The drain of the MOS transistor 110 is connected through a nonmagnetic layer to the pinned ferromagnetic layer 102. The free ferromagnetic layer 104 is connected to a bit line 115 and the source of the MOS transistor 110 is connected the source line 120. The bit line 115 and source select line 120 are connected to the bipolar write pulse/read bias generator 125. The bipolar write pulse/read bias generator 125 provides the necessary programming current to the MTJ element 105 through the bit line 115 and the source select line 120. The direction being determined by logic state being programmed to the MTJ element 105.

The gate of the MOS transistor 110 is connected to a word line 130. The word line 130 is transfers a word line select voltage to the gate of the MOS transistor 110 to activate the MOS transistor 110 for reading or writing the logic state of the MTJ element 105. A sense amplifier 135 has one input terminal connected to the bit line and a second input terminal connected to a voltage reference circuit. When the word line 115 has the word line select voltage activated to turn on the MOS transistor 110, the bipolar write pulse/read bias generator 125 generates a bias current that passes through MTJ element 105. A voltage is developed across the MTJ element 105 that is sensed by the sense amplifier 135 and compared with the reference voltage generator to determine the logic state written to the MTJ element 105. This logic state is transferred to the output terminal of the sense amplifier 135 as to the data output signal 145.

The major difference between conventional MRAM and the SMT MRAM is their programming mechanism. Programming is accomplished by bi-directional current going through the SMT MRAM magnetic layers, while the conventional MRAM is programmed by field generated by external current or currents. Reading is similar for both types of the memories, namely detecting the resistance difference of magnetic tunnel junction depending on whether the free layer magnetic polarity is parallel or anti-parallel with the fixed layer. An SMT MRAM cell is more scalable than the conventional MRAM. However, the bi-directional nature of the programming current through the memory cell transistor results in two bit lines per cell as shown in Hosomi et al. To eliminate the two bit lines per cell of the SMT MRAM's as described by Hosomi et al., what is needed is a memory control apparatus for programming SMT MRAM cells arranged in rows and columns within an array of an SMT MRAM device.

Figure 3:
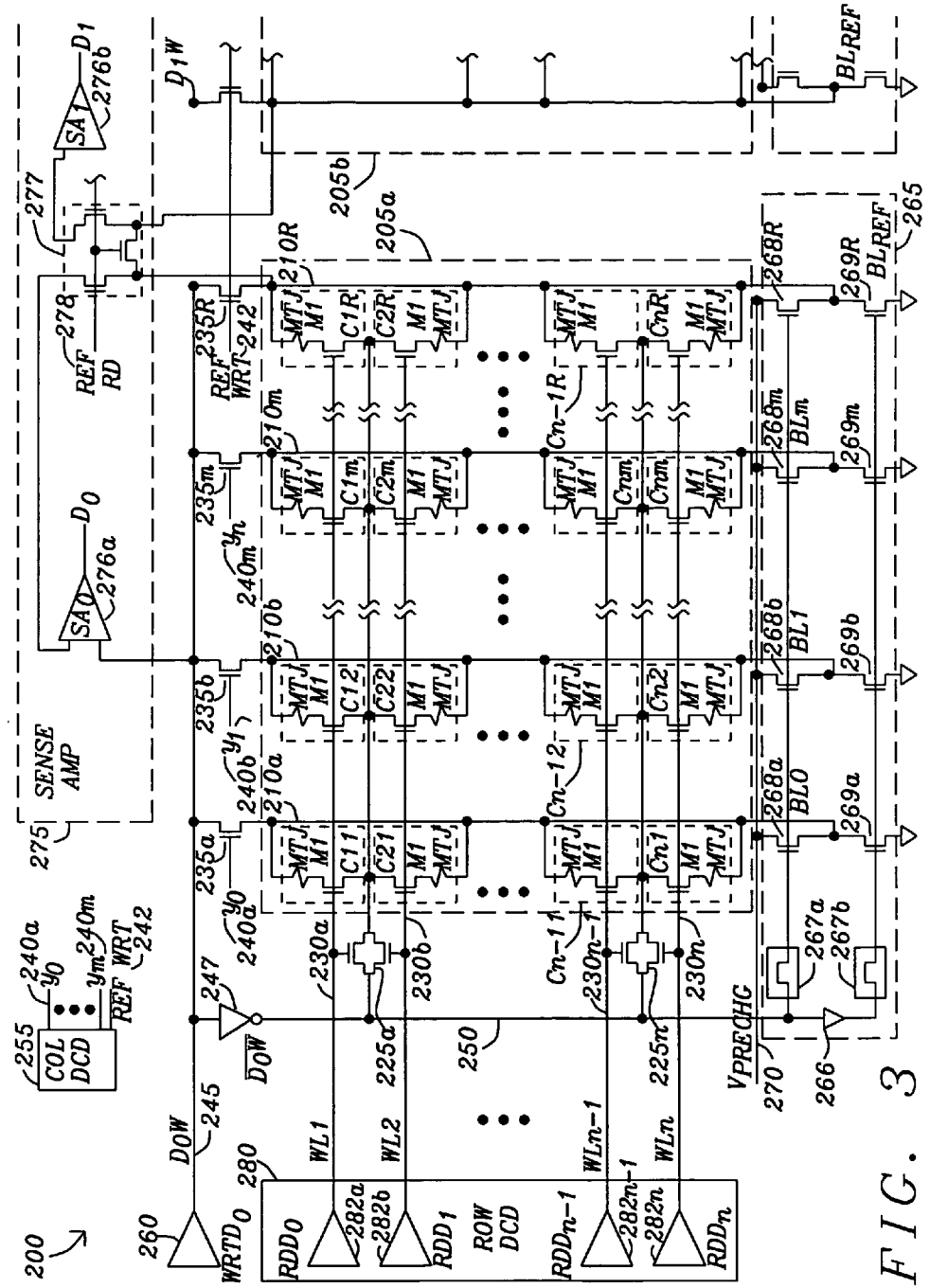
FIG. 3 is schematic diagram of an embodiment of a spin-torque magnetic tunnel junction memory cell array.

Refer now to FIG. 3 for a discussion of an embodiment of a spin-torque magnetic tunnel junction memory cell array having a single bit line memory control apparatus. SMT MRAM cells C11, ..., C1m, ..., Cnm are arranged in rows and columns to form the array 205a. Each column of the SMT MRAM cells C11, ..., C1m, ..., Cnm is connected to one of the bit lines 210a, ..., 210m. One terminal of the MTJ device of each of the SMT MRAM cells C11, ..., C1m, ..., Cnm is connected to its associated bit lines 210a, ..., 210m. A pair of rows of the SMT MRAM cells C11, ..., C1m, ..., Cnm is associated with one of the source lines 215a, ..., 215n. The source of each of the MOS transistors M1 of each of the pairs of rows of the SMT MRAM cells C11, ..., C1m, ..., Cnm is connected to its associated source lines 215a, ..., 215n Each row of the SMT MRAM cells C11, ..., C1m, ..., Cnm is associated with one of the word lines 230a, 230b, ..., 230n. The gate of the MOS transistor M1 of each of the SMT MRAM cells C11, ..., C1m, ..., Cnm is connected to the associated word line 230a, 230b, ..., 230n. Each of the word lines 230a, 230b, ..., 230n are respectively connected to the row decode drivers 282a, 282b, ..., 282n located within the row decode circuit 280. The row decode drivers 282a, 282b, ..., 282n transfer the word line select signal to the selected word lines 230a, 230b, ..., 230n as a result of a decode of an address signal that designates the location of the selected SMT MRAM cell C11, ..., C1m, ..., Cnm The source of each of the column select MOS transistors 235a, ..., 235m is connected to one of the bit lines 210a, ..., 210m. The drain of each of the column select MOS transistors 235a, ..., 235m is connected to receive the in-phase input data signal $D_0W$ 245. The data driver 260 is connected to receive the write data signal from an external source and transfer it to the bit lines 210a, ..., 210m through the column select MOS transistors 235a, ..., 235m. The control for the activation of the switching of the column select MOS transistors 235a, ..., 235m is from the column select signals $y_1$ 240a, $y_2$ 240b, ..., $y_n$ 652b. The column select signals $y_1$ 240a, $y_2$ 240b, ..., $y_n$ 652b are generated by a column decode circuit 255 that receives address signals (not shown) that are used to designate the location within the SMT MRAM array containing the selected SMT MRAM cells C11, ..., C1m, ..., Cnm.

Each of the source lines 215a, ..., 215n is connected to an out-of-phase switching device 225a, ..., 225n. Each out-of-phase switching device 225a, ..., 225n has a first port connected the source lines 215a, ..., 215n for selectively transferring an out-of-phase signal $\overline{D_0W}$ 250 to a selected source line. A second port connected to receive the out-of-phase data signal $\overline{D_0W}$ 250. A control port of the is connected to receive a source line select signal for activating the switching device for transferring the out-of-phase data signal to the selected source line 215a, ..., 215n. In this embodiment, the word line 230a, 230b, ..., 230n for the row containing the selected SMT MRAM cell C11, ..., C1m, ..., Cnm provides the source line select signal to activate the out-of-phase switching device 225a, ..., 225n associated with the selected row.

Each of the bit lines 210a, ..., 210m is connected to the bit line precharge circuit 265. The bit line precharge circuit 265 includes the MOS transistors 268a, 268b, ..., 268m and the MOS transistors 269a, 269b, ..., 269m. The source of each of the MOS transistors 268a, 268b, ..., 268m and each of the drain of the MOS transistors 269a, 269b, ..., 269m are connected together and to their associated bit lines 210a, ..., 210m. The drain of each of the MOS transistors 268a, 268b, ..., 268m is connected to the voltage source $V_{PRECHARGE}$ 270 and the source of each of the MOS transistors 269a, 269b, ..., 269m is connected to the ground reference point. The gates of each of the MOS transistors 268a, 268b, ..., 268m are connected to the one shot circuit (monostable mutivibrator) 267a and each of the MOS transistors 269a, 269b, ..., 269m connected to the one shot circuit 267b. The one shot circuits 267a and 276b provide a brief activation signal to selectively activate and deactivate the MOS transistors 268a, 268b, ..., 268m and MOS transistors 269a, 269b, ..., 269m to connect the bit lines to either the voltage source $V_{PRECHARGE}$ 270 or the ground reference point, dependent on the logical level of the in-phase input data signal $D_0W$ 245 being written to the selected SMT MRAM cell C11, ..., C1m, ..., Cnm. The out-of-phase data signal $\overline{D_0W}$ 250 is connected to the one shot circuit 267a and the input of the inverter 266. The output of the inverter 266 is connected to input the one shot circuit 267b. This structure appropriately charges or discharges the bit lines 210a, ..., 210m.

Each of the bit lines 210a, ..., 210m is connected through the column select MOS transistors 235a, ..., 235m to the sense amplifier 276a of the read sense amplifier circuit 275. Each array 205a and 205b of the SMT MRAM cell C11, ..., C1m, ..., Cnm have a column of reference SMT MRAM cells C1R, ..., CnR that are connected through one terminal of the MTJ elements to the reference bit line 210R. The reference bit line 210R is connected to the source of the reference write gating transistor 235R and the drain of the reference write gating transistor 235R is connected to receive the in-phase input data signal $D_0W$ 245. The control gate of the reference write gating transistor 235R is connected to receive the reference write control signal 242 that activates the reference write gating transistor 235R for writing the appropriate reference level to the reference SMT MRAM cells C1R, ..., CnR.

The reference bit line 210R is connected to the bit line precharge circuit 265 at the junction of the drain of the MOS transistors 268R and 269R. The source of the MOS transistor 268R is connected to the ground reference voltage source and the drain of the MOS transistor 269R is connected to the precharge voltage source $V_{PRECHARGE}$ 270. The MOS transistors 268R and 269R selectively charge and precharge the reference bit line 210R during the programming operation.

The reference bit line 210R is connected through a reference signal averaging circuit 277 to a reference terminal of the sense amplifiers 276a and 276b for reading the pre-established program level for each of the reference SMT MRAM cells C1R, ..., CnR. The reference read signal 278 is applied to the reference signal averaging circuit 277 to activate the reference signal averaging circuit 277 during a read operation. The reference signal averaging circuit 277 averages the reference signal from the reference SMT MRAM cells C1R, ..., CnR and the reference MRAM cells from an adjacent array 205b to create the averages of the two reference cells. The pre-established program level for each of the reference SMT MRAM cells C1R, ..., CnR and the reference MRAM cells from an adjacent array 205b are such that one column is of the reference SMT MRAM cells C1R, ..., CnR and the reference MRAM cells from an adjacent array 205b are programmed to a maximum resistance ($R_{MAX}$) and the other to a minimum resistance ($R_{MIN}$). These values of resistance provide the necessary reference signal values for the sense amplifiers 276a and 276b.

Figure 4:
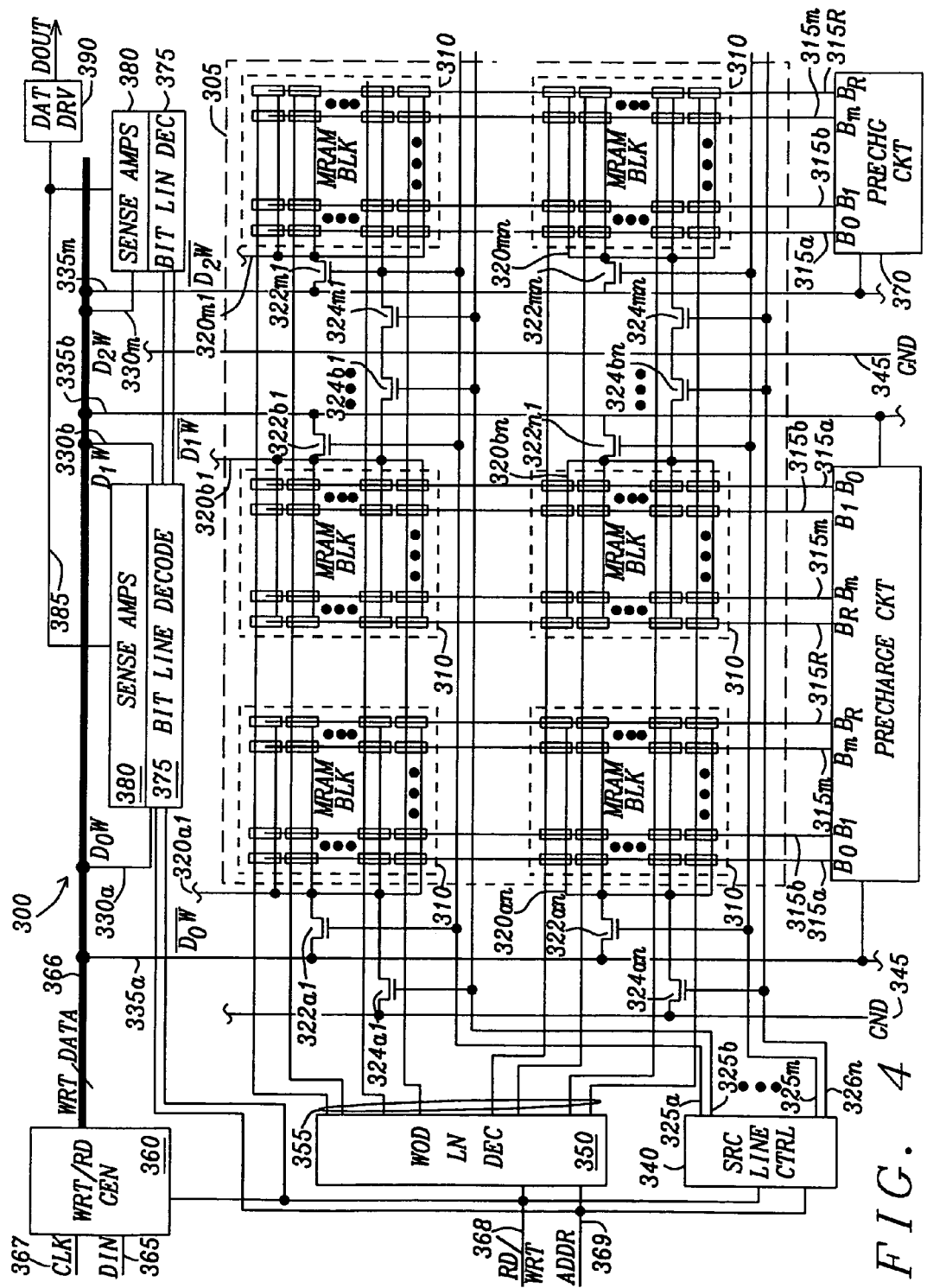
FIG. 4 is block diagram of a spin-torque magnetic tunnel junction memory device.

Refer now to FIG. 4 for a discussion of another embodiment of an SMT MRAM array 305 incorporated in an SMT MRAM integrated circuit device 300. The SMT MRAM array 305 has at least one of the blocks 310 of SMT MRAM cells arranged in rows and columns. Each column of the SMT MRAM cells is connected to a single bit line 315a, 315b, ..., 315m, 315R. The source of each of the MOS transistors of each of the pairs of rows of the SMT MRAM cells within a block 310 of SMT MRAM cells are connected to a source line 320a1, 320b1, ..., 320m1, ..., 320an, 320bn, ..., 320mn.

Each of the source lines 320a1, 320b1, ..., 320m1, ..., 320an, 320bn, ..., 320mn is connected to the first source/drain port of an out-of-phase switching device 322a1, 322b1, ..., 322m1, ..., 322an, 322bn, ..., 322mn. A second source/drain port of each of the out-of-phase switching devices 322a1, 322b1, ..., 322m1, ..., 322an, 322bn, ..., 322mn is connected to receive the out-of-phase data signal $\overline{D_0W}$ 335a, $\overline{D_1W}$ 335b, and $\overline{D_2W}$ 335m. A control port is connected to the source line circuit 340 to receive one of the source line select signals 325a, ..., 325n for activating the switching device for transferring the out out-of-phase data signal $\overline{D_0W}$ 335a, $\overline{D_1W}$ 335b, and $\overline{D_2W}$ 335m to the source line 320a1, 320b1, ..., 320m1, ..., 320an, 320bn, ..., 320mn.

Each of the source lines 320a1, 320b1, ..., 320m1, ..., 320an, 320bn, ..., 320mn is further connected to a first source/drain port of a ground switching device 324a1, 324b1, ..., 324m1, ..., 324an, 324bn, ..., 324mn. A second source/drain port of the ground switching devices 324a1, 324b1, ..., 324m1, ..., 324an, 324bn, ..., 324mn is connected to a ground reference voltage source 345. A control port of each of the ground switching devices 324a1, 324b1, ..., 324m1, ..., 324an, 324bn, ..., 324mn is connected to the source line circuit 340 to receive a ground switch select signal 326a, ..., 326n for activating the ground switching device 324a1, 324b1, ..., 324m1, ..., 324an, 324bn, ..., 324mn to apply the ground reference voltage source to 320a1, 320b1, ..., 320m1, ..., 320an, 320bn, ..., 320mn of non-selected blocks 310 of SMT MRAM cells.

The source line circuit 340 receives an address signal 369 and a read/write signal 368 and decodes these signals to generate the appropriate source line select signals 325a, ..., 325n for the selected rows of the SMT MRAM cells. The inverse of the selected source line select signals 325a, ..., 325n is applied to the non-selected blocks 310 of the SMT MRAM cells to apply the ground reference voltage to the non-selected source lines 320a1, 320b1, ..., 320m1, ..., 320an, 320bn, ..., 320mn.

Each of the word lines 355 connected to the rows of the SMT MRAM cells within each block 310 is connected to the word line decoder 350. The word line decoder receives the read/write control signal 368 and the address signals 369 to activate the MOS gating transistors M1 of each of the SMT MRAM cells in a selected row of the SMT MRAM cells.

A precharge circuit 370 is connected to each of the single bit lines 315a, 315b, ..., 315m, 315R to charge or discharge the single bit line 315a, 315b, ..., 315m, 315R during a programming operation. The structure and function of the precharge circuit 370 is identical to the bit line precharge circuit 265 of FIG. 3. The activation of the precharge circuit 370 for the charging or discharging of the single bit lines 315a, 315b, ..., 315m, 315R is controlled by the out-of-phase data signals $\overline{D_0W}$ 335a, $\overline{D_1W}$ 335b, and $\overline{D_2W}$ 335m.

A bit line decode circuit 375 contains the column select MOS transistors 235a, ..., 235m of FIG. 3 that receives the column select signals $y_1$ 240a, $y_2$ 240b, ..., $y_n$ 652b. As in FIG. 3 the column select MOS transistors 235a, ..., 235m are connected to receive the in-phase input data signals $D_0W$ 330a, $D_1W$ 330b, and $D_2W$ 330m, .... Based on the logic state of the column select signals $y_1$ 240a, $y_2$ 240b, ..., $y_n$ 652b, a column of each of the blocks 310 of SMT MRAM cells is selected for programming or reading. The sense amplifiers 380 are connected to the bit line decoders 375 to receive the read signal during a read operation to determine the data present in the selected SMT MRAM cells. The output of the sense amplifiers 380 is the data output 385 that is presented to the data drivers 390 to transfer through an output bus 395 to external circuitry.

The bit line decoder 375 receives the read/write signal 368 and the address signal 369 to generate the logic state of the column select signals $y_1$ 240a, $y_2$ 240b, ..., $y_n$ 652b for activating the column select MOS transistors 235a, ..., 235m to transfer the data state to and from the selected SMT MRAM cells.

The write/read generator 360 receives data input signal 365 and the clock signal 367 to generate the write data 365 for distribution to the SMT MRAM array 305. The write data 365 is separated in to the individual in-phase input data signals $D_0W$ 330a, $D_1W$ 330b, and $D_2W$ 330m and the out-of-phase data signal $\overline{D_0W}$ 335a, $\overline{D_1W}$ 335b, and $\overline{D_2W}$ 335m.

The common source lines 215a, ..., 215n of FIG. 3 and 320a1, 320b1, ..., 320m1, ..., 320an, 320bn, ..., 320mn of FIG. 4 are shared between at least two rows of SMT MRAM cells. These common source lines 215a, ..., 215n of FIG. 3 and 320a1, 320b1, ..., 320m1, ..., 320an, 320bn, ..., 320mn of FIG. 4 enable the single bit line structure as shown. A program "0" and "1" logic state convention used is such that the current direction from the MTJ element 105 side to the isolation MOS transistor 110 of the cell of FIG. 2 is a logic state of "0" and the current direction from the isolation MOS transistor 110 to the MTJ element 105 side of the cell of FIG. 2 is a logic state of "1". Thus the in-phase input data signals $D_0W$ 245 of FIG. 3 $D_0W$ 330a, $D_1W$ 330b, and $D_2W$ 330m of FIG. 4 is set to a high voltage level and the out-of-phase data signal $\overline{D_0W}$ 250 of FIG. 3 and the out-of-phase data signal $\overline{D_0W}$ 335a, $\overline{D_1W}$ 335b, and $\overline{D_2W}$ 335m of FIG. 4 are set to a low voltage level to program a "0" logic state. Conversely, the in-phase input data signals $D_0W$ 245 of FIG. 3 $D_0W$ 330a, $D_1W$ 330b, and $D_2W$ 330m of FIG. 4 is set to a low voltage level and the out-of-phase data signal $\overline{D_0W}$ 250 of FIG. 3 and $\overline{D_0W}$ 335a, $\overline{D_1W}$ 335b, and $\overline{D_2W}$ 335m of FIG. 4 are set to a high voltage level to program a "1" logic state.

The bit lines 210a, ..., 210m of FIG. 3 and 315a, 315b, ..., 315m of FIG. 4 are charged or discharged appropriately by the precharge circuits 265 of FIG. 3 and 370 of FIG. 4. The precharge circuits 265 of FIG. 3 and 370 of FIG. 4 briefly apply the voltage level of the logic state of the out-of-phase data signal $\overline{D_0W}$ 250 of FIG. 3 and $\overline{D_0W}$ 335a, $\overline{D_1W}$ 335b, and $\overline{D_2W}$ 335m of FIG. 4 to the bit lines 210a, ..., 210m of FIG. 3 and 315a, 315b, ..., 315m of FIG. 4 to appropriately charge or discharge the bit lines 210a, ..., 210m of FIG. 3 and 315a, 315b, ..., 315m of FIG. 4.

Figure 5:
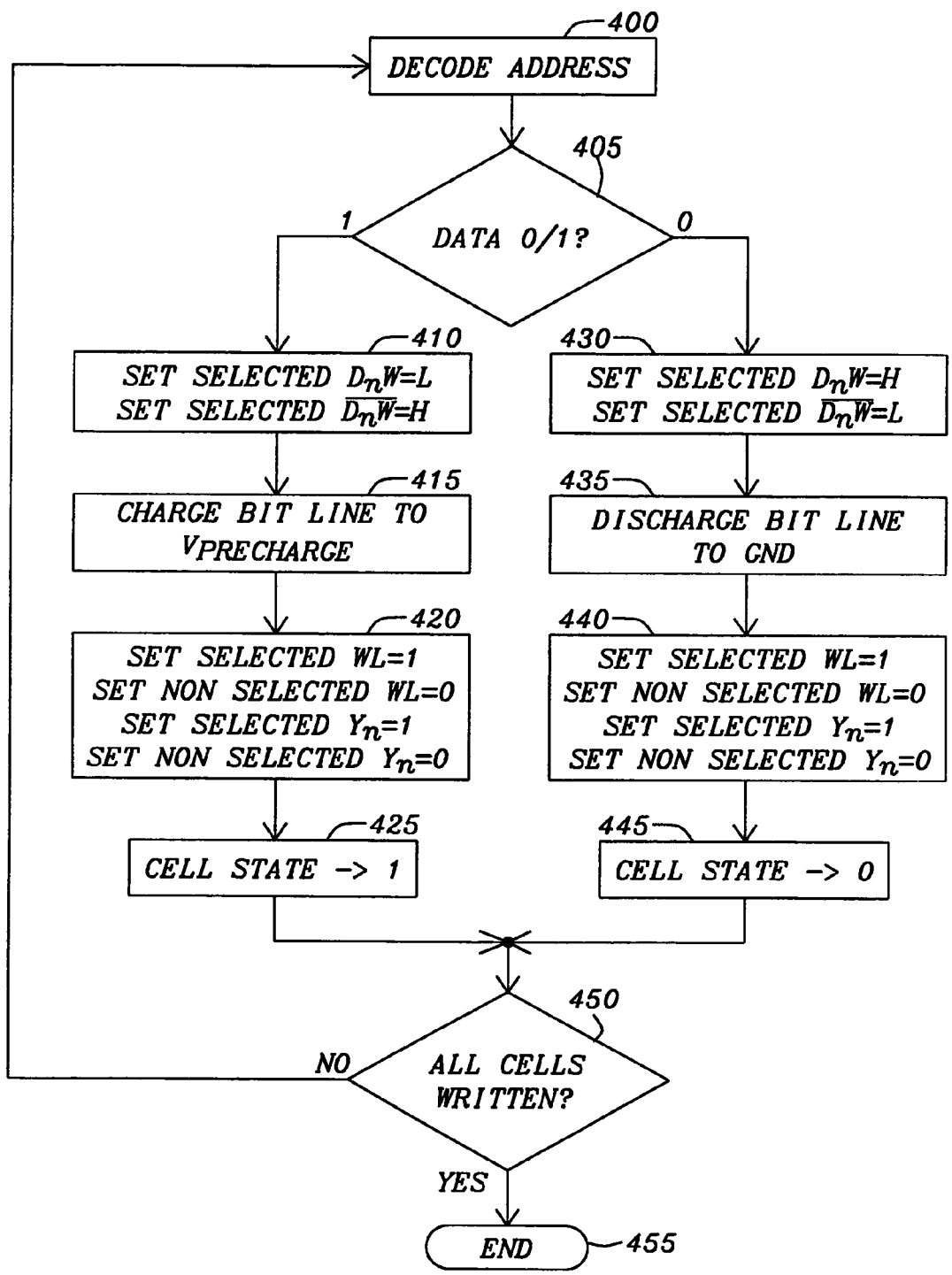
FIG. 5 is process diagram for a method for programming a spin-torque magnetic tunnel junction memory cell array.

Refer now to FIG. 5 to discuss a method for programming selected single SMT MRAM cells in an SMT MRAM array. The process for programming begins by decoding (Box 400) a write address to determine the location with the SMT MRAM array of the selected SMT MRAM cell. The data to be written is then examined (Box 405) to determine the data logic state to be written. If the data to be written is a logic state of "1", the in-phase input data signal $D_nW$ is set (Box 410) to a low voltage level and the out-of-phase data signal $\overline{DnW}$ 250 is set (Box 410) to a high voltage level. The bit lines SMT MRAM array is charged (Box 415) briefly to the voltage level of the precharge voltage source $V_{PRECHARGE}$.

The word line for the row of SMT MRAM cells that contains the selected SMT MRAM cell is set (Box 420) to a logical "1" to activate the isolation transistors of the row containing selected SMT MRAM cell. The word line for the row of the non selected SMT MRAM cells is set (Box 420) to a logical "0" to deactivate the isolation transistors of the row containing selected SMT MRAM cell. The column select signal $y_n$ is set to a logical "1" to activate (Box 420) the column select MOS transistor of the bit line connected to the column of containing the selected SMT MRAM cells to transfer (Box 425) the data state of the logical "1" to the selected SMT MRAM cell.

If the data to be written is a logic state of "0", the in-phase input data signal $D_nW$ is set (Box 430) to a high voltage level and the out-of-phase data signal $\overline{DnW}$ is set (Box 430) to a low voltage level. The bit lines SMT MRAM array is discharged (Box 435) briefly to the voltage level of the ground reference voltage source GND.

The word line for the row of SMT MRAM cells that contains the selected SMT MRAM cell is set (Box 440) to a logical "1" to activate the isolation transistors of the row containing selected SMT MRAM cell. The word line for the row of the non selected SMT MRAM cells is set (Box 440) to a logical "0" to deactivate the isolation transistors of the row containing selected SMT MRAM cell. The column select signal $y_n$ is set to a logical "1" to activate (Box 440) the column select MOS transistor of the bit line connected to the column of containing the selected SMT MRAM cells to transfer (Box 445) the data state of the logical "0" to the selected SMT MRAM cell.

The input data is examined (Box 450) to determine if all the data is has been written to selected SMT MRAM cells. If all the data is not written, the process is started again with the decoding (Box 400) of the incoming address. If all the data is written the process is ended (Box 455).

While this invention has been particularly shown and described with reference to the preferred embodiments thereof, it will be understood by those skilled in the art that various changes in form and details may be made without departing from the spirit and scope of the invention.

The invention claimed is:

1. A memory control apparatus for programming SMT MRAM cells arranged in rows and columns within an array of an SMT MRAM device, the memory control apparatus comprising
    a plurality of single bit lines connecting columns of the SMT MRAM cells for receiving an in-phase data signal;
    a plurality of source lines connecting pairs of rows of the SMT MRAM cells for receiving an out-of-phase data signal;
    a plurality of out-of-phase switching devices, each out-of-phase switching device comprising a first port connected to at least one source line of the plurality of source lines for selectively transferring the out-of-phase signal to the at least one source line, a second port connected to receive the out-of-phase data signal, and a control port connected to receive a source line select signal for activating the switching device for transferring the out-of-phase data signal to the at least one source line; and
    a plurality of column select transistors, each of the plurality of column select transistors comprising a first port connected to one of the plurality of single bit lines, a second port connected to receive the in-phase data signal, and a control port connected to receive a column select signal for selecting one of the columns of the SMT MRAM cells.

2. The memory control apparatus of claim 1 further comprising a precharge circuit connected to the plurality of single bit lines for charging or discharging the single bit lines.

3. The memory control apparatus of claim 1 further comprising a plurality of ground switching devices, each ground switching device of the plurality of ground switching devices comprises a first port connected to at least one of the source lines, a second port connected to a ground reference voltage source, and a control port connected to receive a ground switch select signal for activating the ground switching device to apply the ground reference voltage source to source lines of non-selected SMT MRAM cells.

4. The memory control apparatus of claim 1 wherein the ground switch select signal is an inverse of the source line select signal.

5. The memory control apparatus of claim 1 wherein programming a selected SMT MRAM cell to a first state comprises:
    setting the in-phase data signal to a first level and the out-of-phase data signal to a second level;
    activating the column select signal for selecting the single bit line connected to the selected MRAM cell; and
    activating the source line select signal for selecting the source line connected to the selected MRAM cell;
    wherein a current flows in a first direction through the selected MRAM cell.

6. The memory control apparatus of claim 5 wherein programming a selected SMT MRAM cell to a second state comprises:
    setting the in-phase data signal to the second level and the out-of-phase data signal to the first level;
    activating the column select signal for selecting the single bit line connected to the selected MRAM cell; and
    activating the source line select signal for selecting the source line connected to the selected MRAM cell;
    wherein a current flows in a second direction opposite the first direction through the selected MRAM cell.

7. The memory control apparatus of claim 2 wherein programming a selected SMT MRAM cell to a first state comprises:
    setting the in-phase data signal to a first level and the out-of-phase data signal to a second level;
    activating the column select signal for selecting the single bit line connected to the selected MRAM cell; and
    activating the source line select signal for selecting the source line connected to the selected MRAM cell;
    wherein a current flows in a first direction through the selected SMT MRAM cell.

8. The memory control apparatus of claim 7 wherein programming the selected SMT MRAM cell to the first state;
    briefly charging the plurality of single bit lines to the second level.

9. The memory control apparatus of claim 7 wherein programming the selected SMT MRAM cell to a second state comprises:
    setting the in-phase data signal to the second level and the out-of-phase data signal to the first level;
    activating the column select signal for selecting the single bit line connected to the selected MRAM cell; and
    activating the source line select signal for selecting the source line connected to the selected MRAM cell;

wherein a current flows in a second direction opposite the first direction through the selected MRAM cell.

10. The memory control apparatus of claim 9 wherein programming a selected SMT MRAM cell to the second state further comprises:
   briefly discharging the plurality of single bit lines to the second level.

11. An SMT MRAM device comprising:
   a plurality of SMT MRAM cells arranged in an array of rows and columns;
   a plurality of single bit lines connecting columns of the SMT MRAM cells for receiving an in-phase data signal;
   a plurality of source lines connecting pairs of rows of the SMT MRAM cells for receiving an out-of-phase data signal;
   a plurality of out-of-phase switching devices, each out-of-phase switching device comprising a first port connected to at least one source line of the plurality of source lines for selectively transferring the out-of-phase signal to the at least one source line, a second port connected to receive the out-of-phase data signal, and a control port connected to receive a source line select signal for activating the switching device for transferring the out-of-phase data signal to the at least one source line; and
   a plurality of column select transistors, each of the plurality of column select transistors comprising a first port connected to one of the plurality of single bit lines, a second port connected to receive the in-phase data signal, and a control port connected to receive a column select signal for selecting one of the columns of the SMT MRAM cells.

12. The SMT MRAM device of claim 11 further comprising a precharge circuit connected to the plurality of single bit lines for charging or discharging the single bit lines.

13. The SMT MRAM device of claim 11 further comprising a plurality of ground switching devices, each ground switching device of the plurality of ground switching devices comprises a first port connected to at least one of the source lines, a second port connected to a ground reference voltage source, and a control port connected to receive a ground switch select signal for activating the ground switching device to apply the ground reference voltage source to source lines of non-selected SMT MRAM cells.

14. The SMT MRAM device of claim 13 wherein the ground switch select signal is an inverse of the source line select signal.

15. The SMT MRAM device of claim 11 wherein programming a selected SMT MRAM cell to a first state comprises:
   setting the in-phase data signal to a first level and the out-of-phase data signal to a second level;
   activating the column select signal for selecting the single bit line connected to the selected MRAM cell; and
   activating the source line select signal for selecting the source line connected to the selected MRAM cell;
   wherein a current flows in a first direction through the selected MRAM cell.

16. The SMT MRAM device of claim 15 wherein programming the selected SMT MRAM cell to a second state comprises:
   setting the in-phase data signal to the second level and the out-of-phase data signal to the first level;
   activating the column select signal for selecting the single bit line connected to the selected MRAM cell; and
   activating the source line select signal for selecting the source line connected to the selected MRAM cell;
   wherein a current flows in a second direction opposite the first direction through the selected MRAM cell.

17. The SMT MRAM device of claim 12 wherein programming a selected SMT MRAM cell to a first state comprises:
   setting the in-phase data signal to a first level and the out-of-phase data signal to a second level;
   activating the column select signal for selecting the single bit line connected to the selected MRAM cell; and
   activating the source line select signal for selecting the source line connected to the selected MRAM cell;
   wherein a current flows in a first direction through the selected MRAM cell.

18. The SMT MRAM device of claim 17 wherein programming the selected SMT MRAM cell to the first state further comprises:
   briefly charging the plurality of single bit lines to the second level.

19. The SMT MRAM device of claim 17 wherein programming the selected SMT MRAM cell to a second state comprises:
   setting the in-phase data signal to the second level and the out-of-phase data signal to the first level;
   activating the column select signal for selecting the single bit line connected to the selected MRAM cell; and
   activating the source line select signal for selecting the source line connected to the selected MRAM cell;
   wherein a current flows in a second direction opposite the first direction through the selected MRAM cell.

20. The SMT MRAM device of claim 19 wherein programming a selected SMT MRAM cell to the second state further comprises:
   briefly discharging the plurality of single bit lines to the second level.

21. A method for forming an SMT MRAM device:
   forming a plurality of SMT MRAM cells arranged in an array of rows and columns;
   forming a plurality of single bit lines connecting columns of the SMT MRAM cells for receiving an in-phase data signal;
   forming a plurality of source lines connecting pairs of rows of the SMT MRAM cells for receiving an out-of-phase data signal;
   forming a plurality of out-of-phase switching devices, each out-of-phase switching device comprising a first port connected to at least one source line of the plurality of source lines for selectively transferring the out-of-phase signal to the at least one source line, a second port connected to receive the out-of-phase data signal, and a control port connected to receive a source line select signal for activating the switching device for transferring the out-of-phase data signal to the at least one source line; and
   forming a plurality of column select transistors, each of the plurality of column select transistors comprising a first port connected to one of the plurality of single bit lines, a second port connected to receive the in-phase data signal, and a control port connected to receive a column select signal for selecting one of the columns of the SMT MRAM cells.

22. The method for forming the SMT MRAM device of claim 21 further comprising a forming precharge circuit connected to the plurality of single bit lines for charging or discharging the single bit lines.

23. The method for forming SMT MRAM device of claim 21 further comprising forming a plurality of ground switching devices, wherein forming each ground switching device of the plurality of ground switching devices comprises:
   forming a first port connected to at least one of the source lines;

forming a second port connected to a ground reference voltage source; and forming a control port connected to receive a ground switch select signal for activating the ground switching device to apply the ground reference voltage source to source lines of non-selected SMT MRAM cells.

24. The method for forming SMT MRAM device of claim 21 wherein the ground switch select signal is an inverse of the source line select signal.

25. A method for programming a selected SMT MRAM cell within an SMT MRAM device comprises:

providing an SMT MRAM device comprising:
a plurality of SMT MRAM cells arranged in an array of rows and columns,
a plurality of single bit lines connecting columns of the SMT MRAM cells for receiving an in-phase data signal,
a plurality of source lines connecting pairs of rows of the SMT MRAM cells for receiving an out-of-phase data signal,
a plurality of out-of-phase switching devices, each out-of-phase switching device comprising a first port connected to at least one source line of the plurality of source lines for selectively transferring the out-of-phase signal to the at least one source line, a second port connected to receive the out-of-phase data signal, and a control port connected to receive a source line select signal for activating the switching device for transferring the out-of-phase data signal to the at least one source line, and
a plurality of column select transistors, each of the plurality of column select transistors comprising a first port connected to one of the plurality of single bit lines, a second port connected to receive the in-phase data signal, and a control port connected to receive a column select signal for selecting one of the columns of the SMT MRAM cells;

programming the selected SMT MRAM cell to a first state by the steps of:
setting the in-phase data signal to a first level and the out-of-phase data signal to a second level,
activating the column select signal for selecting the single bit line connected to the selected MRAM cell, and
activating the source line select signal for selecting the source line connected to the selected MRAM cell;
wherein a current flows in a first direction through the selected MRAM cell.

26. The method for programming of claim 25 further comprising programming the selected SMT MRAM cell to a second state comprises:
setting the in-phase data signal to the second level and the out-of-phase data signal to the first level;
activating the column select signal for selecting the single bit line connected to the selected MRAM cell; and
activating the source line select signal for selecting the source line connected to the selected MRAM cell;
wherein a current flows in a second direction opposite the first direction through the selected MRAM cell.

27. The method for programming of claim 25 wherein the SMT MRAM device further comprises a precharge circuit connected to the plurality of single bit lines for charging or discharging the single bit lines.

28. The method for programming of claim 27 wherein the SMT MRAM device further comprises a plurality of ground switching devices, each ground switching device of the plurality of ground switching devices comprises a first port connected to at least one of the source lines, a second port connected to a ground reference voltage source, and a control port connected to receive a ground switch select signal for activating the ground switching device to apply the ground reference voltage source to source lines of non-selected SMT MRAM cells.

29. The method for programming of claim 28 wherein the ground switch select signal is an inverse of the source line select signal.

30. The method for programming of claim 27 wherein programming the selected SMT MRAM cell to the first state further comprises;
briefly charging the plurality of single bit lines to the second level.

31. The method for programming of claim 27 further comprising programming the selected SMT MRAM cell to a second state comprises:
setting the in-phase data signal to the second level and the out-of-phase data signal to the first level;
activating the column select signal for selecting the single bit line connected to the selected MRAM cell; and
activating the source line select signal for selecting the source line connected to the selected MRAM cell;
wherein a current flows in a second direction opposite the first direction through the selected MRAM cell.

32. The method for programming of claim 31 wherein programming a selected SMT MRAM cell to the second state further comprises:
briefly discharging the plurality of single bit lines to the second level.

* * * * *